US008319496B2

(12) United States Patent
Eryaman et al.

(10) Patent No.: US 8,319,496 B2
(45) Date of Patent: Nov. 27, 2012

(54) MAGNETIC RESONANCE METHOD AND APPARATUS FOR REDUCING RF HEATING IN THE PATIENT

(76) Inventors: Yigitcan Eryaman, Ankara (TR); Ergin Atalar, Ankara (TR)

( * ) Notice: Subject to any disclaimer, the term of this patent is extended or adjusted under 35 U.S.C. 154(b) by 420 days.

(21) Appl. No.: 12/751,062

(22) Filed: Mar. 31, 2010

(65) Prior Publication Data
US 2010/0253338 A1   Oct. 7, 2010

Related U.S. Application Data

(60) Provisional application No. 61/165,535, filed on Apr. 1, 2009.

(51) Int. Cl.
*G01V 3/00* (2006.01)

(52) U.S. Cl. ....................................................... 324/309

(58) Field of Classification Search .......... 324/300–322; 600/410–435
See application file for complete search history.

(56) References Cited

U.S. PATENT DOCUMENTS 7,385,396 B2 * 6/2008 Zhu ................................ 324/309

OTHER PUBLICATIONS

"RF Safety of Wires in Interventional MRI: Using a Safety Index," Yeung, et al., Magnetic Resonance in Medicine vol. 47 (2002) pp. 187-193.
"A Green's function approach to local rf heating in interventional MRI," Yeung et al., Med. Phys. vol. 28, No. 5, (2001) pp. 826-832.
"RF Heating Due to Conductive Wires During MRI Depends on the Phase Distribution of the Transmit Field," Yeung et al., Magnetic Resonance in Medicine, vol. 48 (2002) pp. 1096-1098.
"A Catheter Tracking Method Using Reserve Polarization for MR-Guided Interventions," Celik et al., Magnetic Resonance in Medicine, vol. 58 (2007) pp. 1224-1231.
"Evaluation of Specific Absorption Rate as a Dosimeter of MRI-Related Implant Heating," Baker, et al. Journal of Magnetic Resonance Imaging, vol. 20 (2004) pp. 315-320.
"Computing the $B_1$ field of the toroidal MRI coil," Butterworth et al., Journal of Magnetic Resonance vol. 175 (2005) pp. 114-123.
"A Closed-Form Asymptotic Expression for Ultimate Intrinsic Signal-to-Noise Ratio in MRI," Kopanoğlu, et al., Jul. 27, 2009, pp. 1-16.
"MRI Compatible Pacemaker Leads," Ferhanoglu et al., Proc. Intl. Soc. Mag. Reson. Med., vol. 13 (2005) p. 963.
"Simple design changes to wires to substantially reduce MRI-induced heating at 1.5 T: implications for implanted Leads," Gray et al., Magnetic Resonance Imaging, vol. 23 (2005) pp. 887-891.
"On the SAR and Field Inhomogeneity of Birdcage Coils Loaded with the Human Head," Jin, et al., MRM. vol. 38, (1997) pp. 953-963.

(Continued)

*Primary Examiner* — Dixomara Vargas
(74) *Attorney, Agent, or Firm* — Schiff Hardin LLP

(57) ABSTRACT

In a magnetic resonance data acquisition method and system for acquiring data from a patient who carries, either intracorporeally or extracorporeally, a foreign object at least partially composed of electrically conductive material, RF heating to the patient due to the presence of the foreign object is minimized by radiating the patient with RF energy by an RF coil that has a coil design. The sequence of pulses to which the patient is subjected to acquire magnetic resonance data from the patient is configured, in combination with the coil design of the RF coil to steer or modify the electric field that arises in the patient so that RF heating in the patient due to the presence of the foreign object is minimized.

15 Claims, 5 Drawing Sheets

OTHER PUBLICATIONS

"Reduction of Resonant RF Heating in Intravascular Catheters Using Coaxial Chokes," Ladd et al., Magnetic Resonance in Medicine, vol. 43, (2000) pp. 615-619.

"Measuring RF-Induced Currents Inside Implants: Impact of Device Configuration on Mri Safety of Cardiac Pacemaker Leads," Nordbeck, et al., Magnetic Resonance in Medicine, vol. 61 (2009) pp. 570-578.

"Spatial Distribution of RF-Induced E-Fields and Implant Heating in MRI," Nordbeck et al., Magnetic Resonance in Medicine, vol. 60 (2008) p. 313-319.

"Modern Pacemaker and Implantable Cardioverter/Defibrillator Systems Can Be Magnetic Resonance Imaging Safe: In Vitro and In Vivo Assessment of Safety and Function at 1.5 T," Roguin et al., Circulation Journal of the American Heart Association, vol. 110 (2004) 475-482.

"MR Imaging and Cardiac Pacemakers: In Vitro Evaluation and in Vivo Studies in 51 Patients at $0.5 T^1$," Sommer et al., Radiology 2000, vol. 215, pp. 869-879.

"Strategy for Safe Performance of Extrathoracic Magnetic Resonance Imaging at 1.5 Tesla in the Presence of Cardiac Pacemakers in Non-Pacemaker-Dependent Patients: A Prospective Study With 115 Examinations," Sommer et al., Circulation Journal of the American Heart Association, vol. 114 (2006) pp. 1285-1292.

\* cited by examiner

Port 1

Port 2

Lead 1

Lead 2

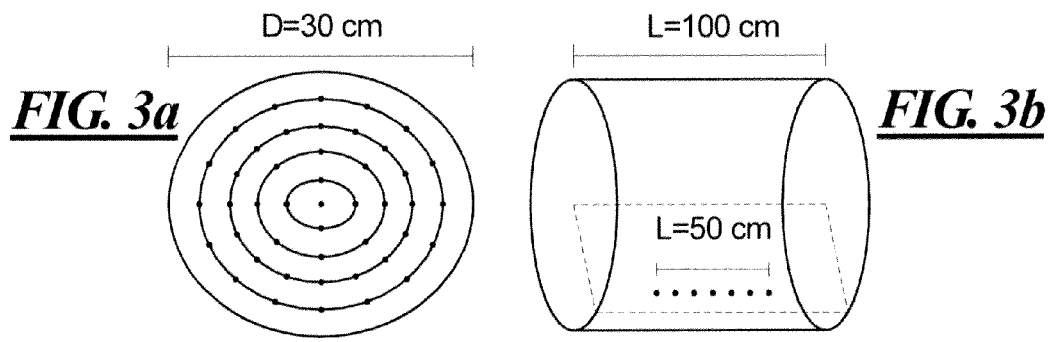
*FIG. 3a*  *FIG. 3b*
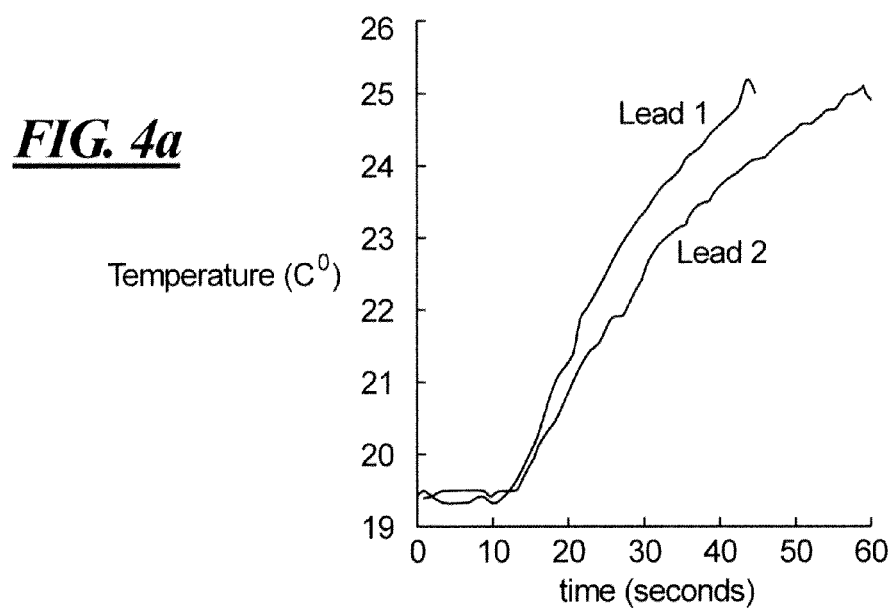
*FIG. 4a*
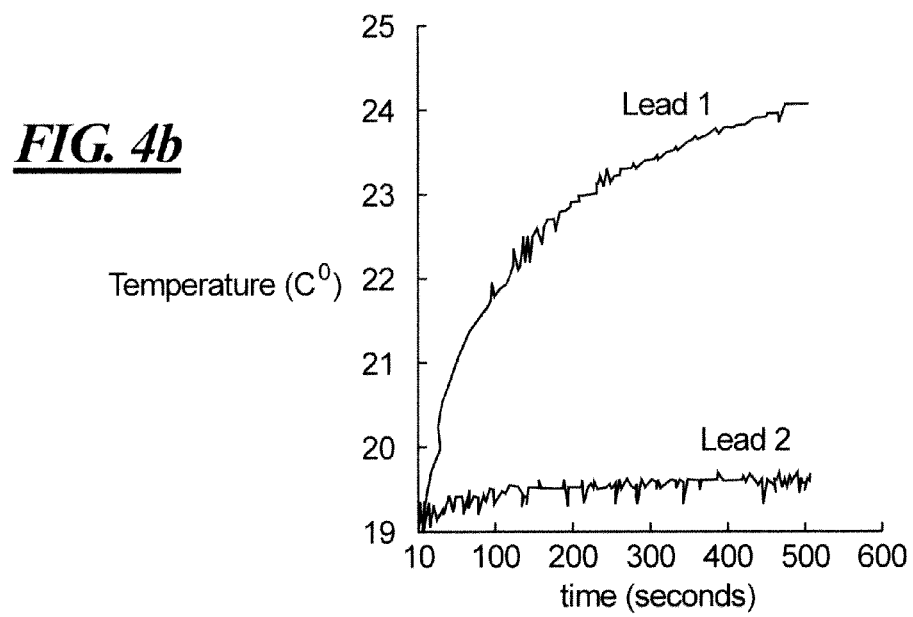
*FIG. 4b*

MAGNETIC RESONANCE METHOD AND APPARATUS FOR REDUCING RF HEATING IN THE PATIENT

RELATED APPLICATION

The present application claims the benefit of the filing date of Provisional Application No. 61/165,535, filed Apr. 1, 2009.

BACKGROUND OF THE INVENTION

1. Field of the Invention

The present invention concerns methods and systems for acquiring magnetic resonance data from an examination subject (patient) wherein the patient is radiated with radio-frequency (RF) energy that subjects the patient to RF heating.

2. Description of the Prior Art

Radiofrequency (RF) heating at the tip of metallic wires is a significant safety problem in MRI (magnetic resonance imaging). Electric field in MRI induces currents on metallic wires which flow through the body and cause SAR (specific absorption rate) amplification near the wire tip.

Previous studies in the literature (Baker et al. "Evaluation Of Specific Absorption Rate as a Dosimeter of MRI-related Implant Heating." Journal of Magnetic Resonance Imaging 20(2) (2004) pgs 315-320 and Vahihaus et al. "MR Imaging and Cardiac Pacemakers: In Vitro Evaluation and in Vivo Studies in 51 Patients at 0.5 T." Radiology 215(3) (2004) pgs 869-879) assessed this heating for both in vitro and in vivo experiments. In other studies more theoretical approaches were governed to analyze the heating problem of implant leads by using mathematical models (Yeung et al. "A Green's function approach to local rf heating in interventional MRI." Medical Physics 28(5) (2001) pgs 826-832 and Yeung et al. "RF Safety of Wires in Interventional MRI: Using A Safety Index." Magnetic Resonance in Medicine 47(1): (2002) pgs 187-193. The validity of these models is then verified by comparison to experimental data. A detailed analysis of the problem was made in Yeung et al. above by solving the bio-heat equation with Green's function approach and linear system theory. Maximum steady state temperature increase in a tissue near a transmitter catheter antenna was calculated. In (see Yeung et al. above) a parameter named "safety index" which combines the effect of SAR gain of the implant lead and the bio-heat transfer process was presented. The variation of safety index with respect to implant lead length and radius, insulation thickness, tissue conductivity and permittivity was also investigated. These studies presented a good model of the tissue heating problem due to metallic wires in RF fields.

The modification of the implant leads and wires for RF heating reduction was investigated in other studies. In two of these studies a series of chokes was added to coaxial cables (Mark E. Ladd, H. H. Q. "Reduction of Resonant RF Heating in Intravascular Catheters Using Coaxial Chokes." Magnetic Resonance in Medicine 43(4): (2000) pgs 615-619. and Ferhanoglu et al. "MRI Compatible Pacemaker Leads", ISMRM 2005 p 963). Amplitude of the currents induced on the cable shield was reduced with this method. In another work Gray et al. "Simple Design Changes to Wires to Substantially Reduce MRI-Induced Heating at 1.5 T: Implications for Implanted Leads." Magnetic Resonance Imaging 23(8): (2005) pgs 887-891) the effect of the coiled wires on the heating was investigated. Self resonance frequency of a coiled wire was shifted to the operating frequency by introducing air gaps and decreasing the parasitic capacitance. With this method it was possible to increase the impedance of the coiled wire and therefore reduce the RF heating. All of these designs are based on modifying the lead wires or cables. With these methods, however, it is difficult to produce mechanically robust leads. In addition, for the patients who already live with pacemakers, the exchange of leads with the modified safe ones may not always be feasible. Because of these reasons modification of implant lead designs or catheters may not always be the most appropriate solution to RF heating problem of metallic wires in MRI.

In a recent study (Nordbeck et al. "Spatial Distribution of RF-induced E-fields and Implant Heating in MRI" Magnetic Resonance in Medicine 60(2): (2008) pgs 312-319), the relationship between electric field distribution and the temperature rise of implant leads is investigated. It was found that orientation of the implant lead with respect to the direction of the electric field may result in different temperature increases however the approach of optimizing the EM transmitter field in order to minimize implant heating was not investigated. In order to find the worst case scenario, an optimization based approach was used in Yeung et al. "RF Heating Due to Conductive Wires During MRI Depends on the Phase Distribution of the Transmit Field" Magnetic Resonance in Medicine 48(6): (2002) pgs 1096-1098 to calculate the EM (electromagnetic) field which can generate maximum heating at the wire tip.

SUMMARY OF THE INVENTION

An object of the present invention is to provide a method and system for acquiring magnetic resonance data from a patient, who carries, either intracorporeally or extracorporeally, a foreign object that is at least partially composed of electrically conductive material, and wherein the method and system minimize the RF heating to which the patient is subjected.

This object is achieved in accordance with the present invention by a magnetic resonance data acquisition method and system wherein the patient is radiated with RF energy by an RF coil that has a coil design with a linear transmit sensitivity profile or an array of RF coils in order to achieve a desired transmit sensitivity profile and wherein the sequence of pulses to which the patient is subjected to acquire magnetic resonance data from the patient is configured, in combination with the linear transmit sensitivity profile of the RF coil or the transmit sensitivity profile obtained by the coil array to steer or modify the electric field that arises in the patient so that RF heating in the patient due to the presence of the foreign object is minimized.

The above object also is achieved in accordance with the present invention by a magnetic resonance data acquisition method and system employing a multi-channel RF transmit array wherein the respective currents supplied to the individual channels are set so as to minimize the average SAR in the examination subject, thereby also reducing RF heating in the examination subject due to the presence of the foreign object.

In accordance with the invention, it was shown that RF transmitter coils in MRI can be optimized to steer the electric field away from an implant lead in order to prevent heating. Experimentally it is demonstrated that a linearly polarized birdcage coil can be used to reduce RF heating, while the homogenous sensitivity characteristics is preserved. This approach, however, comes with the cost of doubling whole body SAR. To solve this issue It was also shown that TX arrays can be used for reduction of RF heating of metallic

BRIEF DESCRIPTION OF THE DRAWINGS

FIGS. 3a and 3b illustrate the homogenous excitation achieved by the coil of FIG. 1 in the examination volume of a magnetic resonance apparatus.

FIGS. 4a and 4b show temperature as a function of time for two electrically conductive leads respectively in orthogonal planes, using a quadrature head coil and a linearly polarized birdcage coil, respectively.

DESCRIPTION OF THE PREFERRED EMBODIMENTS

Figure 7:
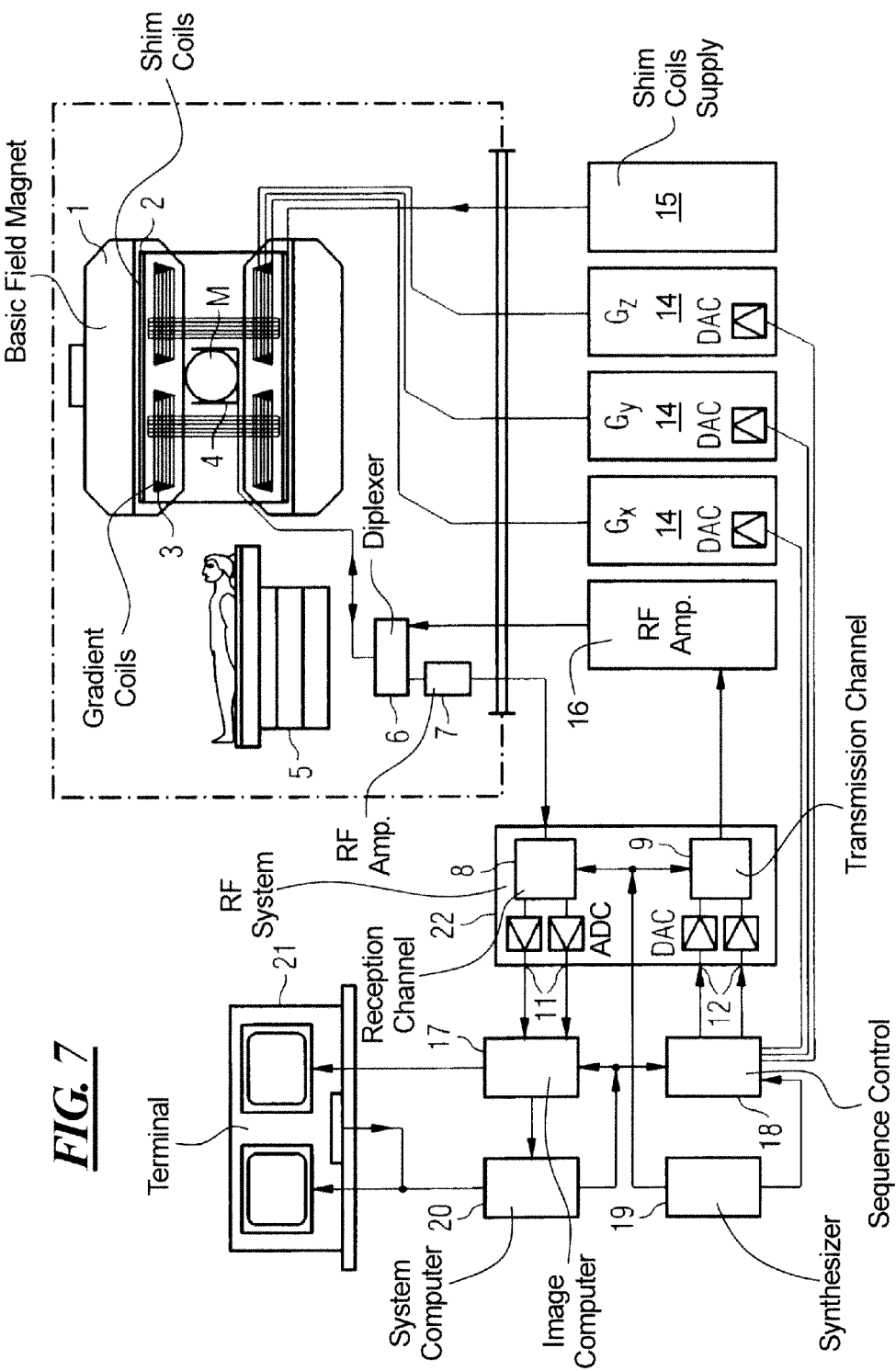
FIG. 7 schematically illustrates a magnetic resonance system constructed and operating in accordance with the present invention.

FIG. 7 is a schematic illustration of a magnetic resonance tomography apparatus operable according to the present invention. The structure of the magnetic resonance tomography apparatus corresponds to the structure of a conventional tomography apparatus, with the differences described below. A basic field magnet 1 generates a temporally constant, strong magnetic field for the polarization or alignment of the nuclear spins in the examination region of a subject such as, for example, a part of a human body to be examined. The high homogeneity of the basic magnetic field required for the magnetic resonance measurement is defined in a spherical measurement volume M into which the parts of the human body to be examined are introduced. For satisfying the homogeneity requirements and, in particular, for eliminating time-invariable influences, shim plates of ferromagnetic material are attached at suitable locations. Time-variable influences are eliminated by shim coils 2 that are driven by a shim power supply 15.

A cylindrical gradient coil system 3 that is composed of three sub-windings is introduced into the basic field magnet 1. Each sub-winding is supplied with current by an amplifier 14 for generating a linear gradient field in the respective direction of the Cartesian coordinate system. The first sub-winding of the gradient field system generates a gradient $G_x$ in the x-direction, the second sub-winding generates a gradient $G_y$ in the y-direction and the third sub-winding generates a gradient $G_z$ in the x-direction. Each amplifier 14 has a digital-to-analog converter that is driven by a sequence controller 18 for the temporally correct generation of gradient pulses.

A radio frequency antenna 4 is situated within the gradient field system 3. This antenna 4 converts the radio frequency pulse output by a radio frequency power amplifier 30 into a magnetic alternating field for exciting the nuclei and alignment of the nuclear spins of the examination subject or of the region of the subject to be examined. The antenna 4 is schematically indicated in FIG. 7. For acquiring magnetic resonance data according to a PPA technique, the antenna 4 is a coil array formed by multiple individual reception coils. The antenna 4 can include a different coil for emitting the RF signals into the subject.

The radio frequency antenna 4 and the gradient coil system 3 are operated in a pulse sequence composed of one or more radio frequency pulses and one or more gradient pulses. The radio frequency antenna 4 converts the alternating field emanating from the precessing nuclear spins, i.e. the nuclear spin echo signals, into a voltage that is supplied via an amplifier 7 to a radio frequency reception channel 8 of a radio frequency system 22. The radio frequency system 22 also has a transmission channel 9 in which the radio frequency pulses for exciting the nuclear magnetic resonance are generated. The respective radio frequency pulses are digitally represented as a sequence of complex numbers in the sequence controller 18 on the basis of a pulse sequence prescribed by the system computer 20. As a real part and an imaginary part, this number sequence is supplied via an input 12 to a digital-to-analog converter in the radio frequency system 22 and from the latter to a transmission channel 9. In the transmission channel 9, the pulse sequences are modulated onto a high-frequency carrier signal having a base frequency corresponding to the resonant frequency of the nuclear spins in the measurement volume.

The switching from transmission mode to reception mode ensues via a transmission-reception diplexer 6. The radio frequency antenna 4 emits the radio frequency pulses for exciting the nuclear spins into the measurement volume M and samples resulting echo signals. The correspondingly acquired nuclear magnetic resonance signals are phase-sensitively demodulated in the reception channel 8 of the radio frequency system 22 and converted via respective analog-to-digital converters into a real part and an imaginary part of the measured signal. An image computer 17 reconstructs an image from the measured data acquired in this way. The management of the measured data, of the image data and of the control programs ensues via the system computer 20. On the basis of control programs, the sequence controller 18 controls the generation of the desired pulse sequences and the corresponding sampling of k-space. In particular, the sequence controller 18 controls the temporally correct switching of the gradients, the emission of the radio frequency pulses with defined phase and amplitude as well as the reception of the magnetic resonance signals. The time base (clock) for the radio frequency system 22 and the sequence controller 18 is made available by a synthesizer 19. The selection of corresponding control programs for generating a magnetic resonance image as well as the presentation of the generated magnetic resonance image ensue via a terminal 21 that has a keyboard as well as one or more picture screens.

The apparatus shown in FIG. 7 operates in accordance with the present invention by virtue of an appropriate pulse sequence (protocol) being entered by an operator via the terminal 22 into the system computer 20 and the sequence control 18.

Figure 1:
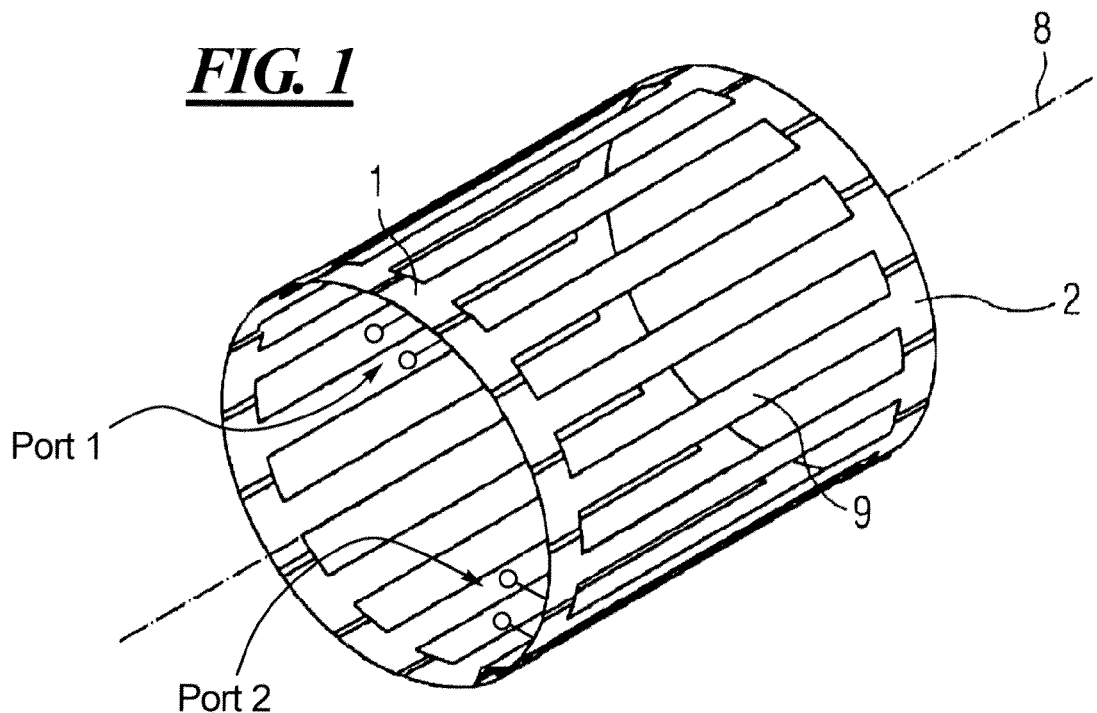
FIG. 1 shows a linear polarized birdcage antenna of the type suitable for use in accordance with the present invention.

FIG. 1 shows a birdcage coil of the type used in accordance with the present invention as the RF coil 4 in the system shown in FIG. 7. The RF coil of FIG. 1 has linear strip conductors 9 having respective T-shapes 1 and 2 at opposite ends thereof connected by capacitors (now shown) to form end rings. In the embodiment of FIG. 1 the birdcage coil is linearly polarized and has a diameter of 28 cm and a length of 32 cm. In order to obtain a linearly polarized transmit field, the coil is connected to the transmit channel from port 1, leaving port 2 unconnected, thereby obtaining a zero electric field plane coinciding with the position of port 2.

A multi-channel RF transmit array (TX array) also can be used wherein individual currents are supplied to the respective resonators of the array. An examination subject is shown inside the transmit array. The circuitry of supplying respective currents to the individual resonators is well known to those of ordinary skill in the field of magnetic resonance imaging and need not be described herein. As explained in detail below, however, such a transmit array is used in accordance with the present invention with respective currents to the individual resonators that are set, in accordance with the discussion below, to minimize the average SAR in the examination subject, so as to also reduce or minimize RF heating in the examination subject that occurs due to the presence of a foreign object, composed at least in part of electrically conductive material, which is carried by the examination subject, either intracorporeally or extracorporeally.

Figure 2:
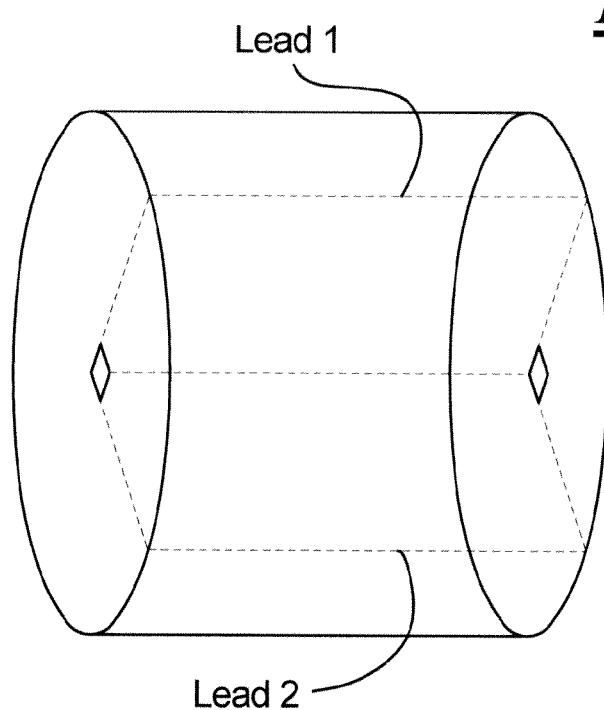
FIG. 2 schematically illustrates a gel phantom for testing the RF radiation emitted into the examination volume of a magnetic resonance apparatus, for acquiring data to substantiate the structure and operation of the inventive method and apparatus.

A gel phantom is shown in FIG. 2 having two resonant length (18 cm) wires in two orthogonal planes. Fiber optic temperature measurements are performed near the tip of the lead wires to obtain the temperature curves shown in FIGS. 4a and 4b discussed below. When a quadrature birdcage is used to radiate the phantom with RF energy, both leads 1 and 2 experience a similar electric field. When a linear birdcage coil is used, lead 1 experiences a high electric field while lead 2 experiences zero field. It should be noted, however, that the basis of the invention is applicable to non-homogenous subjects as well.

As shown in FIGS. 3a and 3b, to ensure homogenous excitation, coil sensitivity is constrained to unity at sample points (such as 45 sample points) forming a circular region having a radius of 13 cm in a transverse plane. The electric field is constrained to zero at seven sample points on a straight line, having a distance to the phantom boundary of 2 cm.

Theory
Implant Friendly RF Coil

In the standard quadrature birdcage coils electric field is uniform in the angular direction, but varies roughly linearly in the radial direction (Jin et al. "On the SAR and Field Inhomogeneity of Birdcage Coils Loaded with the Human Head." Magnetic Resonance in Medicine 38(6): (1997) pgs 953-963). Therefore, an implant lead placed at the edge of the body experiences high electric field. High electric field induces currents on the lead which eventually flow through the body and causes local SAR amplification. The electric field distribution of a standard forward polarized quadrature birdcage coil in a homogenous body model can be approximated as follows (the derivation of which is set forth in the Derivation section below):

$$E_z = \frac{-H_f \omega \mu_0 \rho}{2} e^{j\phi}, E_\phi = 0, E_\rho = 0 \qquad (1)$$

where $E_z$, $E_\phi$, $E_\rho$, are the longitudinal, angular and radial components of electric field, respectively. $H_f$ is the transmit sensitivity of the coil. Here $\omega_0$ is the Larmor frequency, $\mu_0$ and $\epsilon$ are the permeability and permittivity of the homogenous body. $\rho$ and $\phi$ are the radial and angular coordinates in cylindrical coordinate system. j is the imaginary number defined by $\sqrt{-1}$. Similarly the electrical field of a linearly polarized coil can be expressed as follows:

$$E_z = -H_f j \omega \mu_0 \rho \sin\phi, E_\phi = 0, E_\rho = 0 \qquad (2)$$

As it can be understood from above equations, linear and quadrature birdcage coils have different electric field distributions corresponding to the same transmit sensitivity. The transmit sensitivities of each coils are approximately uniform in the transverse plane (please see the appendix for derivation). It can be noted in the above equation, that the electric field is zero on an entire $\phi=0$ plane. This plane can be steered into any angular direction by rotating the linear birdcage coil. Same task can also be realized by controlling the amplitudes of the currents fed into the two port of the birdcage coil. Let port 1 and port 2 of the birdcage coil lie on the $\phi=0$ and $\phi=\pi/2$ planes, respectively. The excitation currents with relative amplitudes of $\sin\phi_0$ and $\cos\phi_0$ and at two ports, would generate a zero electric field plane at $\phi=\phi_0$. It can readily be seen that the most trivial case for this type of excitation is leaving one of the ports unconnected, in order to obtain a zero electric field plane at the angle of that unconnected port. If an implant lead lies on the zero-electric-field plane, there will be no induced currents on the lead. Note that setting electric field to zero makes the perpendicular component of the magnetic field vanish at that plane and therefore, this method also prevents H-field coupling intrinsically.

Using a linear birdcage coil solves the heating problem for an arbitrary shaped implant lead with the condition that the lead is located in the zero-electric-field plane. On the other hand the transmit-sensitivity remains unchanged. However as it was shown previously (Glover et al. "Comparison of Linear and Circular-Polarization for Magnetic-Resonance Imaging" Journal of Magnetic Resonance 64(2): (1985) pgs 255-270) that linear birdcage coils are not efficient for RF transmission when whole body average SAR is considered. For linear excitation, reverse polarized field component co-exists with the forward polarized component. Due to this fact whole body SAR per unit flip angle is doubled.

Transmit Field Optimization

In order to alleviate the whole body SAR problem a general formulation is developed. The cylindrical basis functions are used to expand the optimum field solution which minimizes whole body SAR (Ocali et al. "Ultimate Intrinsic Signal-to-Noise Ratio in MRI" Magnetic Resonance in Medicine 39(3): (1998) pgs 462-473 and Celik et al. "Evaluation of Internal MRI Coils Using Ultimate Intrinsic SNR" Magnetic Resonance in Medicine 52(3): (2004) pgs 640-649)

$$\vec{E} = \sum_{m=-\infty}^{\infty} \sum_{m=-\infty}^{\infty} \vec{E}mn \qquad (3)$$

Expression for each separate mode $\vec{E}mn$ can be written as: $\vec{E}mn = E_{mn} \cdot \vec{\alpha} mn \cdot e^{jm\phi} e^{-j\beta_z z} \phi$ and z are the angular and z coordinates in the cylindrical coordinate system. m and n are integer variables representing the expansion modes. $E_{mn}$ is a 3×2 matrix which contains the electric field basis functions for $\rho$, $\phi$ and z components which are shown in the appendix. $E_{mn}$ is a function of $\rho$, the radial coordinate, but not $\phi$ or z. $\vec{\alpha} mn$ is a 2×1 vector whose elements are the constants that multiply the basis functions and $\vec{\alpha} mn = [A_{mn} B_{mn}]^T$ The coil sensitivity can be expressed by evaluating the forward polarized field which can also be written in the summation form as:

$$H_f(\vec{r}) = \sum_{mn} \vec{H}\,fmn(\vec{r}) \cdot \vec{\alpha} mn \quad (4)$$

Each separate mode for $H_f$ can be expressed as follows:

$$\vec{H}\,fmn(\vec{r}) = \frac{1}{\sqrt{2}} \left[ \frac{j\sigma'}{\beta_{pn}}, \frac{\beta_{zn}}{\beta_{pn}} \right] J_{m+1}(\beta\rho) e^{j(m+1)\phi} e^{-j\beta_{zn}z} \quad (5)$$

where $\beta$ is the wave number which can be calculated as $$\beta^2 = -j\omega\mu_0[\sigma + j\omega_0\varepsilon] \cdot \beta_{zn} = \frac{2\pi}{L}n,$$

$$\beta_{pn}^2 = \beta^2 - \beta_z^2 \text{ and } \sigma' = \sigma' + j\omega\varepsilon$$

(Celik et al. "Evaluation of Internal MRI Coils Using Ultimate Intrinsic SNR" Magnetic Resonance in Medicine 52(3): (2004) pgs 640-649)

It should be noted that although cylindrical modes are described above, this formulation can be modified to other types of modes. As is known to those skilled in the art, the choice of the modes depends on the subject geometry.

For multiple points of interests of number k, whole summation in $H_f$ expression can be written in the following matrix form:

$$H\alpha = c \quad (6)$$

c, the desired transmit sensitivity profile, is represented by a k×1 vector whose elements are equal to desired $H_f$ values at each point of interest. α is a column vector which contains the weighting coefficients ($A_{mn}B_{mn}$) for each separate mode. Finally $H_f$ is the transmit sensitivity matrix whose elements are equal to the basis functions of $H_f$ evaluated at the desired point of interests. H is a k×(2×M×N) matrix. Here, M and N denote the total number of circumferential (m) and longitudinal (n) modes which is used in the basis expansion. In order to characterize any EM field with this expansion an infinite number of modes is required. For practical purposes, the numbers of modes are truncated. The desired target transmit sensitivity is one of the linear constraints for minimizing whole body SAR. There also exists a separate constraint on electric field in order to guarantee no implant heating. In order to achieve the no implant-heating condition, the component of electric field, which is parallel to the lead should be set to zero and therefore induce current on the lead wire will be nulled. This condition can also be expressed as a linear constraint, similar to $H_f$ as shown below:

$$E\alpha = \vec{0} \quad (7)$$

where $\vec{0}$ is a vector with all of its elements equal to zero and matrix E contains the basis functions for $E_z$, $E_\phi$, $E_\rho$ evaluated at the desired zero electric field locations. The constraints on $H_f$ and components of electric field can be combined into a single matrix equation as $F\alpha = e$ where F and e are formed by concatenating the matrices B, E and the vectors c and $\vec{0}$, respectively.

While it is desired to set the magnetic and electric field certain values in points of interests, specific absorption rate (SAR) needs to be under control. The expression for the whole body SAR is:

$$SAR = \sigma/M \int_{body} |E|^2 dv \quad (8)$$

where σ is the conductivity and M is the total body mass. Using the cylindrical mode expansion, for a homogenous body model the following relation can be written as:

$$SAR = (\sigma/M) x \sum_{mn} \vec{\alpha}_{mn}^H \cdot R_{mn} \cdot \vec{\alpha}_{mn} \quad (9)$$

where $R_{mn}$ is a Hermitian matrix and can be computed by using the following expression (Celik et al. "Evaluation of Internal MRI Coils Using Ultimate Intrinsic SNR" Magnetic Resonance in Medicine 52(3): (2004) pgs 640-649):

$$R_{mn} = [2\pi L \sigma \int_0^{body} E_{mn} \rho d\rho] \quad (10)$$

Finally the whole body SAR can be expressed in a more compact form α*Rα where R is the electric field cross correlation matrix whose block diagonals are equal to $R_{mn}$. Among infinite number of solutions satisfying Fα=e, the one with the minimum whole body SAR can be found by minimizing α*Rα. The solution for α can then be found as $$\alpha_{opt} = R^{-1}F^*(FR^{-1}F^*)^{-1}e \quad (11)$$

The minimum whole body SAR value can be computed as:

$$SAR_{min} = e^*(FR^{-1}F^*)^{-1}e \quad (12)$$

These equations give the minimum possible SAR under the conditions of desired transmit sensitivity and zero electric field near the implant. It also gives the corresponding weights for the EM modes. Although this solution does not tell the type of the coil, it provides the EM field of the optimum coil. Significance of this result can be appreciated by experiments and simulations explained in the next section.

Theory of Implementation with Transmit Arrays

Transmit array technology can be used to generate field patterns similar to the ones discussed in the previous section. Similar to the cases explained above whole body SAR can be reduced while simultaneously reducing local SAR due metallic objects in the body. TX arrays, the phase and magnitude of the currents on separate channels of a transmit coil can be chosen arbitrarily. Usually the excitation pattern of currents is adjusted in order to satisfy a given SAR or transmit field homogeneity constraint. In addition to SAR and homogeneity, the electric field distribution is another concern for reduction of RF heating. In this section it is shown that it is possible to obtain a homogenous transmit field distribution with minimum average SAR, with the condition that the metallic device inside the body experiences zero or minimal electric field. It should be noted that this method can be used to minimize the whole body average SAR and/or a partial volume average SAR and/or the peak SAR in general. By choosing the excitation current patterns similar to the currents in the legs of a linear birdcage coil, this goal can easily be achieved. The excitation pattern for a linearly polarized field is given as $\alpha_i = A \sin(2\pi i/N - \phi_0)$, where i is the index of the channel carrying the current $\alpha_i$ and 1<N< and $\phi_0$ denotes the angular position of the plane that the metallic device is located. N is the number of channels in the transmit array. Once the position of the device is found, $\phi_0$ can be found. The heating extension of the device can have a shape of arbitrary geometry including loop structures. As long as the shape is bounded in a thin angular slice heating is minimized. The main concern with this approach is that the volume average SAR is doubled with respect to a quadrature excitation similar to the case with a linear birdcage coil. To solve this issue the current excitation pattern should be modified in order to minimize the volume average SAR. While doing so, the maximum electric field experienced by the implant should be kept bounded. Additionally the transmit field homogeneity should be preserved. Let α be a vector of size N×1 whose elements are the complex currents on each channel of a TX array. E and B are the electric field and transmit sensitivity matrices where Eα=c, Bα=d and c and d give the value of the electric field and the sensitivity at desired locations in the body. Whole body average SAR is equal to α*Rα where R is the electric field cross correlation matrix. To minimize average SAR α*Rα should be minimized. While doing so, the elements of c should be bounded around 1 with an amount of ∂ to ensure homogeneity. In addition, the elements of d should be bounded between 0 and Ψ to reduce RF heating.

The geometry of the coil elements of the TX array is arbitrary. The combination of any types of coil elements, including circular, rectangular, elliptical, butterfly, spiral, and birdcage coils (to name only a few examples) can be used to reduce implant heating according to the method and apparatus described herein.

Experiments and Simulations
Implant Friendly RF Coil

In order to demonstrate the theory, heating of bare-wires in both linear and quadrature birdcage coils were tested. For this purpose a gel phantom with radius 12 cm and length 30 cm is prepared by placing two resonant length bare wires (18 cm) at two orthogonal planes as shown in FIG. 2. The phantom is prepared by using commercially available gel (Dr Oetker Jello, Izmir, Turkey). To measure conductivity and relative permittivity a cylindrical transmission line set up is used. By measuring the impedance at the end of the line, and using lossy transmission line impedance equations, conductivity and the relative permittivity is calculated (Akin et al., "A Method for Phantom Conductivity and Permittivity Measurements", ESMRMB 2009). By using this setup conductivity of 0.5 S/m and relative permittivity of 70 are measured after adding 2 grams/liter salt to the gel solution.

A linearly polarized high-pass birdcage coil with length of 32 cm and diameter of 28 cm was built by using a fiber glass material, and copper strips as shown in FIG. 1. The coil was tuned and matched to 63.87 MHz with a reflection coefficient less than 0.15 at its two ports. In order to obtain a linearly polarized transmit field the coil was connected to the transmit channel of the scanner from a single port, leaving the other port unconnected, hence obtaining a zero electric field plane coinciding with the position of unconnected port.

While one phantom experiment was conducted by the home-made linearly polarized coil and the other experiment was conducted using a GE quadrature T/R head coil, both by using a 1.5 T GE Signa scanner. SPGR sequence with flip angle of 90 degrees and TR of 4.3 msec was used to scan the phantoms. The other scan parameters were adjusted to obtain scan time of 500 seconds.

Temperature variations near the wire tips at the two orthogonal planes were recorded by using Neoptix ReFlex signal conditioner and T1 fiber optic temperature sensors (Neoptix Inc, Quebec City, Canada) Fiber optic probes were placed in a way to ensure contact with the wire tip. The temperature data for each lead was obtained in different scans but to ensure a fair comparison, a wait was undertaken until reaching the same initial temperature (19.4 degrees). The 500 second scan was interrupted when a temperature rise of 6 degrees was obtained to prevent melting.

Transmit Field Optimization

The linearly polarized birdcage coils solve the RF heating problem of implant leads. However linear coils increase whole body average SAR by a factor of 2. This may be too much of an increase for some applications: therefore one may need to find alternative implant friendly solutions to reduce whole body SAR. Alternative solutions must guarantee similar or better MR image homogeneity when compared to birdcage coils. For this purpose computer simulations are performed in order to optimize the field inside a uniform phantom. The radius and the EM properties of the body model are chosen as identical with the phantom used in the heating experiments. (conductivity: 0.5 S/m, relative permittivity: 70, radius: 15 cm and length: 100 cm. The field solutions obtained by these calculations can be used to design better transmit coils with a given transmit sensitivity and minimum average SAR. The solutions are the EM field solutions that an ideal coil for given specific constrains. An inverse problem may be solved to find the coil design that would achieve the calculated field distribution (Lattan zi et al., "Electrodynamic Constraints on Homogeneity and Radiofrequency Power Deposition in Multiple Coil Excitations." Magnetic Resonance in Medicine 61(2): (2009) pgs 315-334).

Five separate optimum field solutions are computed regarding five different sets of conditions. The descriptions of these conditions are given below.

Quadrature Birdcage Coil

The field distribution of an ideal quadrature coil can be obtained by using the above-mentioned optimization algorithm but with no constraint on the electric field. In this calculation only a single point at the center of the object is assumed to be the point of interest. Due to angular symmetry, the solution contains a single cylindrical mode, corresponding to a field of a forward polarized birdcage coil. The calculated whole body average SAR using this method can be considered as the minimum SAR one can obtain with a birdcage coil.

Linear Birdcage Coil

The field of the linearly polarized birdcage coil is directly constructed from the pervious solution by introducing a reverse circular polarization mode into the solution. For this purpose the conjugate of the field expansion coefficients calculated for the quadrature case were used for the reverse polarized mode. According to the theory on which the invention is based, this solution should contain a zero electric-field plane. If this field coincides with the plane of the implant lead, no implant heating will be observed. Although one may call the linearly polarized coil as implant friendly coil, the whole body SAR obtained using this solution is twice higher than quadrate birdcage coil and therefore a better solution is investigated.

Implant Friendly Coil

In order to minimize the electric field around the implant lead the location of the implant lead is assumed to be known. For the demonstration purpose, a 50 cm straight implant lead is assumed and assumed to be placed 2 cm away from the boundary the along the long axis of the object (FIG. 3).

Coil transmit sensitivity is chosen similar to the sensitivity of linear birdcage coil. For this purpose, the optimization problem is solved by assuming the exact same transmit sensitivity values of the linearly polarized birdcage coil at sample points shown in FIG. 3. The tangential component of the electric field is set to zero at sample points on a lead as shown in FIG. 3. By doing so it is guaranteed that the average SAR will be less compared to a linear birdcage coil since the transmit sensitivity was preserved but the electric field constraints were relaxed.

Coil with Homogenous Sensitivity

In an MRI study, it is usually desired to obtain a homogenous transmit sensitivity in a region of interest. To realize this condition the coil sensitivity is constrained to unity at 45 points in the transverse plane (FIG. 3). The optimum field that gives the minimum whole body average SAR with the sensitivity constraint is calculated and compared to previous solutions.

Implant Friendly Coil with Homogenous Sensitivity

Similar to previous conditions a homogenous transmit sensitivity is desired. Target profile for $H_f$ with multiple (FIG. 3) points in the transverse plane is assumed to obtain a uniform transmit sensitivity. The tangential component of the electric field is set to zero at sample points on a lead (FIG. 3). Results of the above mentioned experiments and simulations are given in the next section.

Implementation with Transmit Arrays

To demonstrate the field modification with TX arrays, simulations of an 8 channel transmit coil array was performed by using an electromagnetic simulation software. The body is assumed as a homogenous cylinder and a straight metallic wire is assumed to exist in the body 2 cm away from the boundary (FIG. 8) First quadrature field is used to excite the body model by using the current expressions $\alpha_i = \exp(2\pi j \cdot i/N)$ where j is the imaginary number $\sqrt{-1}$ Then, a linear field is used to excite the model. The metallic wire is assumed to be located at the plane $\phi = \pi/6$. The excitation pattern for the coils is chosen as $\alpha_i = 2 \sin(2\pi i/8 - \pi/6)$ to ensure RF heating reduction. Finally optimized currents are calculated for whole body average SAR minimization. Note that similar method can also be implemented to minimize partial volume average SAR and/or peak SAR. c is chosen such that z component of the electric field is sampled at 7 points separated by 3 cm along the wire. Similarly d is chosen such that the transmit sensitivity is sampled at 45 points distributed uniformly in a transverse imaging plane. The value of $\Psi$ is chosen as $\Psi = 8.9$ to ensure that the maximum electric field experienced on the wire is 5 times less than quadrature case. Finally $\partial$ is chosen as 0.2 to ensure that the transmit sensitivity does not vary more than 20 percent in the imaging plane.

Results

Implant Friendly RF Coil

FIG. 4 shows the time course of the temperature increase in both linearly polarized and quadrature coils near the resonant length straight wire placed at 2 different locations in the gel phantom. As seen in the figure, for the GE quadrature coil, 6 degrees of temperature rise was observed at the tip of wires on $\phi=0$ and $\phi=90$ planes in 42 and 57 seconds, respectively. The difference is within our experimental errors. This experiment verifies the well-known fact that uniform electric field is generated in the circumferential direction by a quadrature birdcage coil.

For the linearly polarized coil, the temperature rise in 500 seconds at the tip of electrodes on $\phi=0$ and $\phi=90$ planes were 1.0 and 5.2 degrees respectively. Due to sinusoidal variation in electric field in the linear mode, temperature increase in $\phi=0$ plane is minimal, while a significant temperature increase can easily be observed in $\phi=90$ plane. The difference between wire-tip heating occurred in the two orthogonal planes was expected as the property of a linear birdcage coil (Jin et al. "On the SAR and Field Inhomogeneity of Birdcage Coils Loaded with the Human Head" Magnetic Resonance in Medicine 38(6): (1997) pgs 953-963).

Note that since linear and quadrature birdcage experiments were conducted using two different coils (home-made linear coil versus GE quadrature head coil) comparison between linear and quadrate cases were not done.

Transmit Field Optimization

In order to alleviate the whole body SAR problem due to linearly polarized birdcage coil, problem was solved in its most general form by minimizing whole body SAR. For this purpose five different optimum field solutions were computed regarding 5 different sets of conditions as described earlier. A homogeneity coefficient was calculated for each sensitivity solution. For this purpose the magnitude of the difference between the sensitivity of each pixel and the sensitivity of the mid point is averaged in the transverse plane. Note that a zero homogeneity coefficient would mean a perfectly homogenous sensitivity profile.

Quadrature Birdcage Coil

Figure 5:
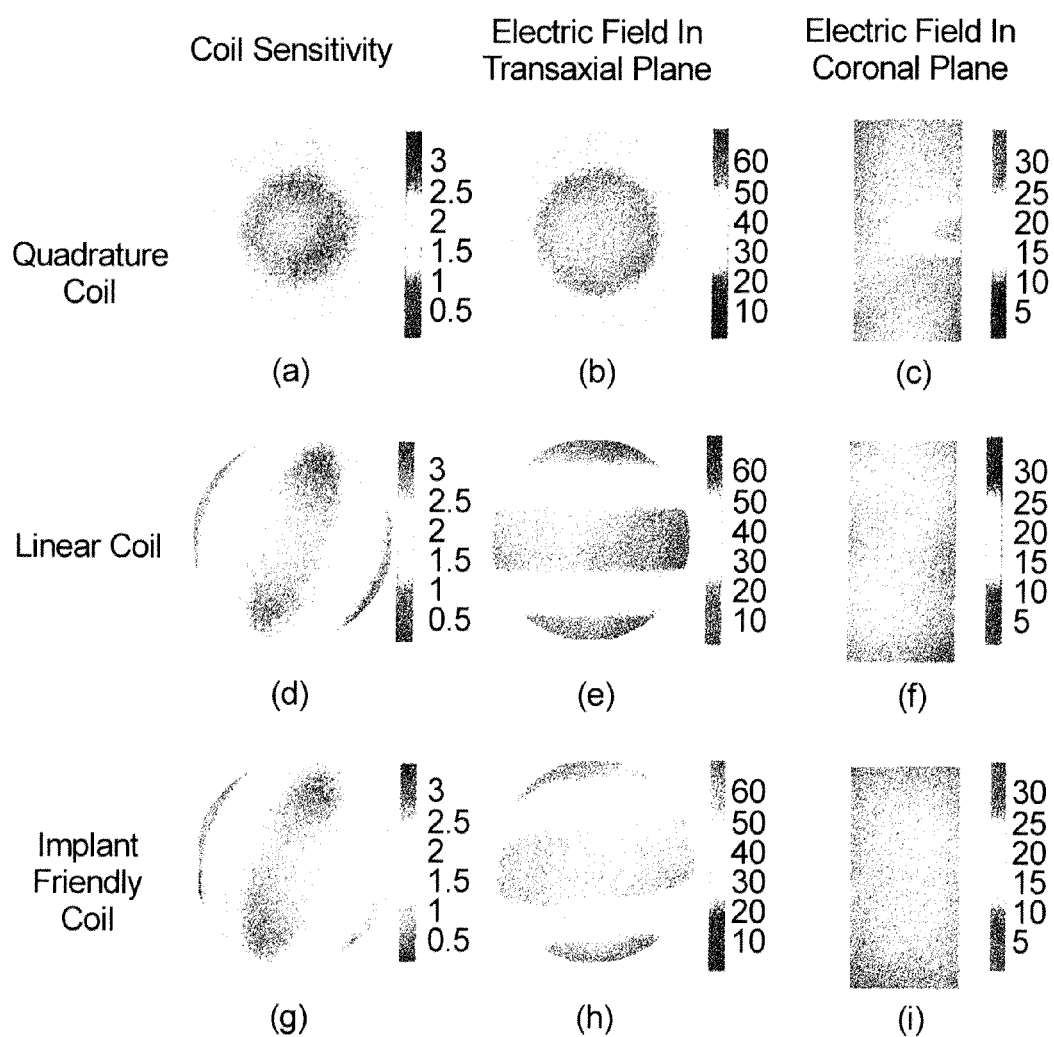
FIGS. 5a, 5d and 5g show the sensitivity in the transaxial plane.
FIGS. 5b, 5e and 5h show the electric field in the transaxial plane.
FIGS. 5c, 5f and 5i show the electric field in the coronal plane, for quadrature, linear and implant friendly coils.

FIG. 5a shows the sensitivity of the birdcage coil. The longitudinal component of the electric field on transaxial plane and on $\phi=0$ plane is shown in FIG. 5-b and FIG. 5-c. The resulting minimum whole body average SAR was also calculated. Due to angular symmetry the solution imposes a single cylindrical mode, corresponding to a perfectly forward circular polarized field distribution. The whole body SAR value was defined as 1 au (arbitrary unit) for this case. This SAR value sets a lower bound for whole body SAR, since $H_f$ is constrained only at the origin. SAR results of the rest of the coils were defined with respect to this result. The homogeneity coefficient regarding this solution was found to be 0.41.

Linear Birdcage Coil

A linearly polarized field was obtained in the previous solution as explained before. FIG. 5d shows the sensitivity of the linear birdcage coil. The longitudinal component of the electric field on transaxial plane and on $\phi=0$ plane is shown in FIG. 5-e and FIG. 5-f. This field solution has a zero electric field plane which makes it safe in terms of RF implant heating and its sensitivity is equal to 1 at the origin. The SAR value obtained by this field configuration is 2 au as expected. Linear coil does not have exactly the same sensitivity with a quadrature coil but have a similar homogeneity coefficient which was calculated as 0.46.

Implant Friendly Coil

FIG. 5g shows the sensitivity of the implant friendly coil. The longitudinal component of the electric field on transaxial plane and on $\phi=0$ plane is shown in FIG. 5-h and FIG. 5-i. The longitudinal component of the electric field was forced to be equal to zero only around the implant lead. However as it can be seen from the figures the electric field is zero on the lead and close to zero in the rest of the $\phi=0$ plane. The relaxed constraints on electric field resulted in a decrease in whole body SAR down to 1.47 au. The implant friendly coil has a very similar field solution with respect to a linear birdcage coil although not exactly the same. The homogeneity coefficient for this solution is the same as the linear coil, 0.46 as expected.

Coil with Homogenous Sensitivity

Figure 6:
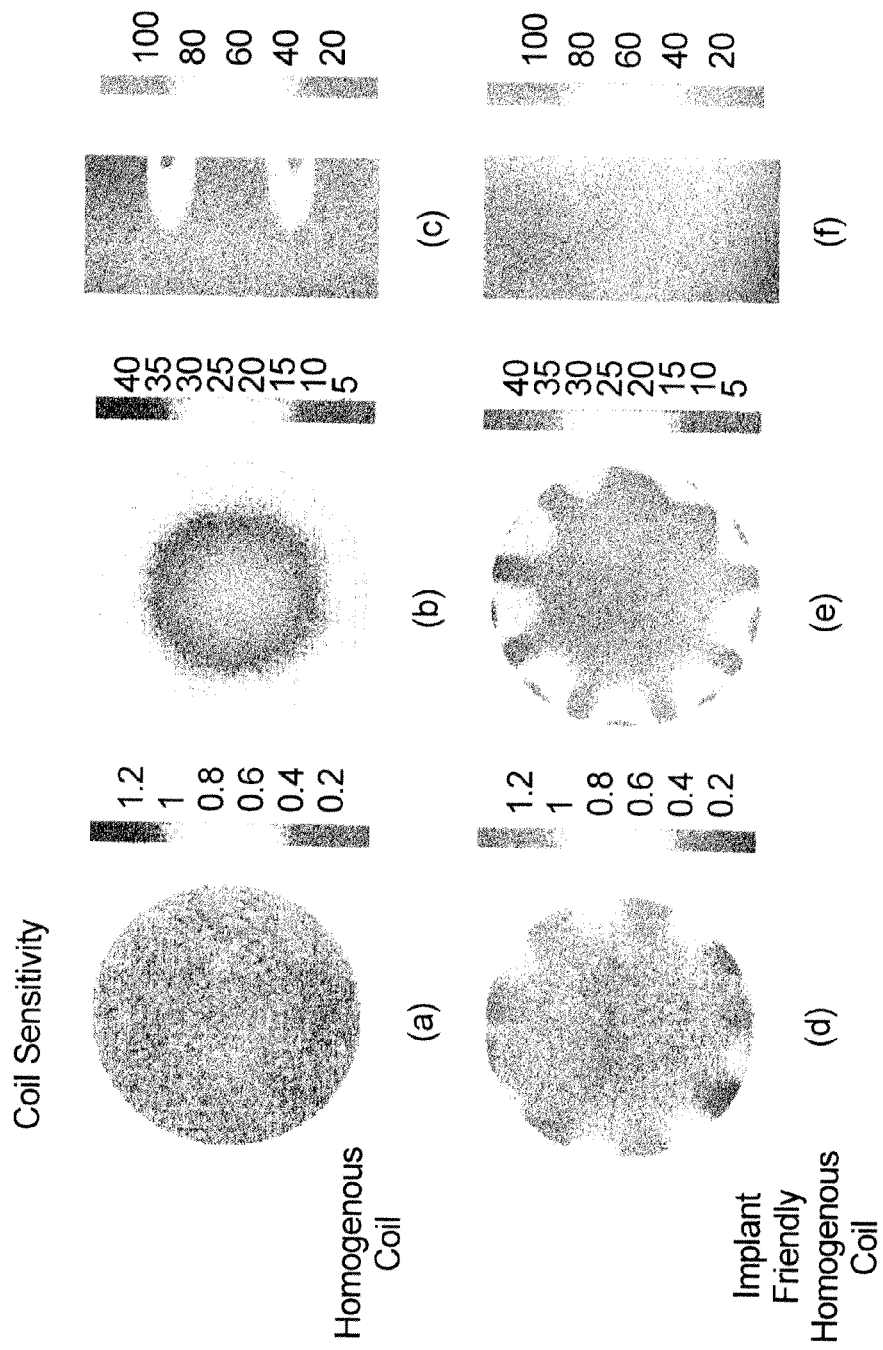
FIGS. 6a and 6d show the sensitivity in the transaxial plane.
FIGS. 6b and 6e show the electric field in the transaxial plane.
FIGS. 6c and 6f show the electric field in the coronal plane for a homogenous coil (FIGS. 6a, 6b, 6c) and an implant friendly homogenous coil (FIGS. 6d, 6e and 6f).

The homogeneity of the transmit sensitivity is important for most applications in MRI A constraint on coil sensitivity at a single point may not be enough to provide a homogenous sensitivity in the whole transverse plane. In order to generate a homogenous sensitivity, field was set to unity at 45 sample points distributed uniformly in a circular region. The radius of the region is taken as 13 cm (FIG. 3). The sensitivity of the homogenous coil is calculated and shown in FIG. 6a. The minimum whole body SAR for this case is calculated as 17.5 au. Homogeneity coefficient for this case was calculated as 0.0037. The penalty for obtaining a homogenous field was a very significant increase in the whole body SAR. Fixing the field to a constant value at a circular region requires using higher order cylindrical modes in the solution which finally increases SAR. The longitudinal component of the electric field on transaxial plane and on $\phi=0$ plane is shown in FIG. 6-b and FIG. 6-c.

Implant Friendly Coil with Homogenous Sensitivity

By assuming the same homogenous coil sensitivity as in the previous case, longitudinal electric field is set to zero on an implant lead. FIG. 6d shows the sensitivity of the implant friendly homogenous coil. The longitudinal component of the electric field on transaxial plane and on φ=0 plane are shown in FIG. 6-e and FIG. 6-f. The whole body SAR value obtained for this case is found as 18.25 au which is very close to the SAR of the homogenous coil to image a circular region. Homogeneity coefficient for this solution was 0.0233. This result implies that it is possible to build an implant friendly coil without disturbing the homogeneity and also with a slight increase in SAR.

Implementation with Transmit Arrays

The images of transmit sensitivity and the z component of electric field in the transverse plane can be seen as an electric field at the angular plane which the wire is assumed to exist. In order to compare the volume average SAR values of quadrature, linear, and optimum excitation currents the SAR values are normalized by the mean value of transmit sensitivity in the imaging plane. The linear coil had a SAR twice as the quadrature coil as expected. The SAR due to optimum currents was 1.4 times the SAR value of quadrature excitation. A reduction of 30% in SAR is achieved by the optimum excitation currents with respect to linear coil. The homogeneity of the optimum current pattern is better than linear excitation.

Conclusion

It is shown herein that using linear birdcage coil as a transmitter coil in MRI can enable safe scanning of patients with implants. Linear birdcage coil has a similar transmit sensitivity when compared to a quadrature birdcage coil. However the electric field distribution of the linear coil is zero at an angular plane therefore a metallic implant placed at this plane experiences zero heating. The angle of this plane can be adjusted to any angle $\phi=\phi_0$ by supplying appropriate excitation currents weighted with $\cos \phi_0$ and $\sin \phi_0$ in two ports of the linear birdcage coil. This task can be realized by using a 2 channel transmit array system, which is commercial in some MRI scanners.

Linear coils can solve RF heating problem of implant leads in MRI. However the linear coils cause twice as large whole body SAR with respect to quadrature coil. To find solutions that reduce the SAR, computer simulations were performed. Instead of making a new coil design, the field distributions of the coils that satisfy above conditions, are calculated. These field solutions give important clues for the RF coil design. For example in FIG. 5 d-e-f it is easily seen that the electric field of the implant friendly coil is a slightly distorted version of the field of a linear birdcage coil. This shows that by modifying the geometry of a linear coil SAR can be reduced without sacrificing homogeneity.

Another example is the field solution for a homogenous coil. FIGS. 6a, 6b and 6c show that the homogenous coil can simply be implemented by using two quadrature coils. By placing two quadrature coils parallel to z axis with the same distance from x=0 plane a perfectly homogenous coil sensitivity can be achieved at that plane.

These calculated field distributions can also be realized by using multi-channel transmit arrays. By controlling the currents on separate channels of a transmit array, the calculated optimum field distributions can be approximated. As the number of channels increase the approximation will get better. Using transmit phased arrays to reduce RF heating in implants is a new concept. In this work a similar concept which can directly be applied to two-channel transmit arrays, is verified with a linear birdcage coil. However effectiveness of this task with multi-channel transmit array systems should also be investigated experimentally.

For the calculated fields a certain profile for transmit sensitivity was assumed to ensure homogeneity in the transverse plane. This profile consisted of 45 sample points that are distributed uniformly in angular direction, covering a circular region of 13 cm radius. On the other hand the electric field was set to zero on a linear profile (corresponding to a 50 cm long hypothetical lead 2 cm near the boundary). 7 sample points was used to set the electric field to zero along the lead. The calculated field and minimum SAR values may depend on the choice of these profiles. The number of sample points to be used, and the location of each point in these profiles has an effect on the calculated field and SAR. The investigation of this effect can be important especially if these field calculations are to be used for coil design.

Knowing the location of the implant helps to reduce average SAR as it was shown in the manuscript. For this purpose rather than obtaining zero electric field planes as in the linear birdcage coil case, electric field can be set to zero only near the implant. In order to find the position of the lead low SAR scans can be performed prior to examination (Celik et al. "A Catheter Tracking Method Using Reverse Polarization for MR-Guided Interventions" Magnetic Resonance in Medicine 58(6): (2007) pgs 1224-1231); then this information can be used to calculate the optimum excitation currents of a transmit phased array.

Other strategies can be implemented if multi channel transmit arrays are to be used to reduce implant heating. To reduce implant heating setting the electric field distribution to zero in a region is not always necessary. One can set a tolerance value prior to the scan and perform the optimization with the constraint that electric field is bounded within some specified value in a desired region. Similar constraints can be imposed on the transmit coil sensitivity, so that the sensitivity is permitted to fluctuate within desired boundaries. Since these would increase the number of freedoms one could also reduce whole body SAR with this method.

In all the experiments and simulations homogenous phantoms are used to demonstrate the theory. For real life situations, body conductivity variation may introduce some errors to the field calculations. In order to prevent implant RF heating a zero-electric field region is generated around the implant. Although in this manuscript, we obtained such regions in phantoms using special implant friendly coils such as linear birdcage coil, the performance of these designs needs to be tested in patients. In a previous work (Jin et al. "On the SAR and Field Inhomogeneity of Birdcage Coils Loaded with the Human Head" Magnetic Resonance in Medicine 38(6): (1997) pgs 953-963), the electric field distribution of linearly polarized coil was calculated for a head model and the existence of the zero-electric field region was demonstrated for different field strengths including 1.5 T.

In summary, metallic device heating is reduced by steering the electric field away from the implant lead is possible without disturbing the sensitivity of a transmit coil. Experimentally it is shown that a linearly polarized birdcage coil can be used to scan patients with implants safely with the cost of doubling the whole body SAR. To alleviate the SAR problem, implant-friendly electromagnetic field solutions with desired sensitivity and minimum SAR was calculated. In addition simulations of 8 channel transmit array system was performed. It was shown that reduction of RF heating of metallic devices can be achieved with transmit arrays by simultaneously reducing average SAR.

Moreover, it should be noted that although the present invention has been described according to the exemplary embodiments relating to magnetic resonance imaging, the method and apparatus described herein are applicable for use in any electrical device that produces an electrical field that interacts with a patient carrying a foreign body that is composed at least partially of electrically conductive material, in order to reduce or minimize RF heating in the subject due to the presence of the foreign object.

Derivation

Cylindrical mode solutions of the Maxwell's equations (Foo et al. "An Analytical Model for the Design of Rf Resonators for MR Body Imaging" Magnetic Resonance in Medicine 21(2): (1991) pgs 165-177) can be used to express the EM field of birdcage coils. The total electric field is the summation of the cylindrical modes that are shown below (Celik et al. "Evaluation of Internal MRI Coils Using Ultimate Intrinsic SNR" Magnetic Resonance in Medicine 52(3): (2004) pgs 640-649):

$$E_{zmn} = A_{mn} J_m(\beta_{pn}\rho) e^{jm\phi} e^{-j\beta_{zn}z} \quad (13)$$

$$E_{\phi mn} = \left[ \frac{A_{mn}}{\rho\beta} J_m(\beta_{pn}\rho) + \frac{\omega\mu}{\beta} B_{mn} J'_m(\beta_{pn}\rho) \right] e^{jm\phi} e^{-j\beta_{zn}z} \quad (14)$$

$$E_{\rho mn} = \left[ \frac{B_{mn}}{\sigma'\rho} J_m(\beta_{pn}\rho) - j A_{mn} J'_m(\beta_{pn}\rho) \right] e^{jm\phi} e^{-j\beta_{zb}z} \quad (15)$$

$$H_{\rho mn} = \left[ \frac{-m\beta^2 A_{mn}}{\omega\mu\rho\beta_{pn}^2} J_m(\beta_{pn}\rho) - \frac{\beta_{zn} B_{mn}}{\beta_{pn}} J'_m(\beta_{pn}\rho) \right] e^{jm\phi} e^{-j\beta_{zn}z} \quad (16)$$

$$H_{\phi mn} = \left[ \frac{-jm\beta_{zn} B_{mn}}{\rho\beta_{pn}^2} J_m(\beta_{pn}\rho) - \frac{\sigma' A_{mn}}{\beta_{pn}} J'_m(\beta_{pn}\rho) \right] e^{jm\phi} e^{-j\beta_{zn}z} \quad (17)$$

The $E_{mn}$ matrix can be constructed for each mode as shown below:

$$E_{mn} = \begin{bmatrix} J_m(\beta_{pn}\rho) & 0 \\ \frac{1}{\rho\beta} J_m(\beta_{pn}\rho) & \frac{\omega\mu}{\beta} J'_m(\beta_{pm}\rho) \\ \frac{1}{\sigma'\rho} J_m(\beta_{pn}\rho) & -j A_{mn} J'_m(\beta_{pn}\rho) \end{bmatrix} \quad (18)$$

where) $\beta_{zn} = \frac{2\pi}{L} n$, $\beta_{pn}^2 = \beta^2 - \beta_{zn}^2$ and $\sigma' = \sigma + j\omega\varepsilon$.

m and n are mode index integers which defines the variation of the mode solution in $\phi$ and z direction.

On the other hand the forward and reversed polarized magnetic field components for transmission are defined as (Celik et al. "A Catheter Tracking Method Using Reverse Polarization for MR-guided Interventions" Magnetic Resonance in Medicine 58(6): (2007) pgs 1224-1231):

$$H_f = \frac{(H_\rho - jH_\phi)e^{-j\phi}}{\sqrt{2}}, H_r = \frac{(H_\rho + jH_\phi)e^{j\phi}}{\sqrt{2}} \quad (19)$$

The field distribution of forward polarized and reverse polarized birdcage coils can be approximated by using $m=\pm 1$ and $n=0$ cylindrical expansion modes. For the standard forward polarized coil $m=+1$ mode should be used. With the following approximations can be made on Bessel functions:

$$\text{if } x \ll 1 \text{ then } J_{-1}(x) \sqcup -\frac{x}{2}, J_1(x) \sqcup \frac{x}{2} \text{ and } -J_0(x) \sqcup 1 \quad (20)$$

Then the cylindrical mode solutions for the forward polarized birdcage coil can be simplified as:

$$E_z = \frac{A\beta\rho}{2} e^{j\phi}, E_\phi = \frac{\omega\mu B}{2\beta} e^{j\phi}, E_\rho = \frac{-jB\omega\mu}{2\beta} e^{j\phi}, H_f = -\frac{A\beta}{\omega\mu_0}, H_r = 0 \quad (21)$$

A and B are constants which depend on the excitation current and the geometry of the coil. As it is seen from the expression of $H_f$ the constant B does not have an effect on the forward polarized magnetic field component. Therefore for the most efficient excitation B should be equal to zero to minimize SAR.

Then the field of the forward polarized birdcage coil can be expressed as shown below:

$$E_\phi = E_\rho = 0, E_z = \frac{H_f \omega \mu_0 \rho}{2} e^{j\phi}, H_f = -\frac{A\beta}{\omega\mu_0}, H_r = 0 \quad (22)$$

With the same approximations field expressions of a reverse polarized birdcage coil can be found by using $m=-1$ mode:

$$E_\phi = E_\rho = 0, E_z = \frac{H_f \omega \mu_0 \rho}{2} e^{j\phi}, H_f = 0, H_r = \frac{A\beta}{\omega\mu_0} \quad (23)$$

By adding the expressions of forward and reverse polarized field one can obtain the approximate field components of a linear coil as:

$$E_\phi = E_\rho = 0, E_z = -H_f j\omega\mu_0\rho\sin\phi, H_f = -\frac{A\beta}{\omega\mu_0}, H_r = -\frac{A\beta}{\omega\mu_0} \quad (24)$$

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance imaging system comprising:
   a magnetic resonance data acquisition unit comprising a basic field magnet with an opening therein adapted to receive an examination subject therein, said examination subject carrying, extracorporeally or intracorporeally, a foreign object at least partially formed of electrically conductive material;
   said magnetic resonance data acquisition unit comprising a gradient coil system and a radio-frequency (RF) coil system that at least partially surround the examination subject in said opening, said RF coil system having a coil design;
   an RF transmit system connected to said RF coil system that supplies current to said RF coil system to radiate an RF field in the examination subject disposed in said opening, said RF field contributing to production of an electric field in the examination subject that causes RF heating of the examination subject;
   a gradient coil control system connected to said gradient coil system that supplies current to said gradient coil system to produce gradient magnetic fields in said examination subject;

a sequence controller connected to said RF transmit system and said gradient coil control system, said sequence controller being configured to operate said RF transmit system and said gradient coil control system to activate and deactivate said RF field and said gradient magnetic fields in a sequence to produce, spatially encode, and read out magnetic resonance signals in said examination subject;

an input unit in communication with said sequence controller configured to provide said sequence controller with information describing electrically conductive characteristics of said foreign object; and said sequence controller being configured to use said information to set said sequence, in combination with said design of said RF coil, to steer or modify said electric field to minimize RF heating in the examination subject due to the presence of said foreign object.

2. A magnetic resonance imaging system as claimed in claim 1 wherein said examination subject has a specific absorption rate (SAR) for RF energy associated therewith, and wherein said sequence controller is configured to set said sequence to minimize said RF heating by minimizing said SAR.

3. A magnetic resonance imaging system as claimed in claim 1 wherein said foreign object comprises an elongate electrically conductive element, and wherein said sequence controller is configured to set said sequence to minimize said RF heating by minimizing a component of said electric field parallel to said elongate electrically conductive element.

4. A magnetic resonance imaging system as claimed in claim 1 wherein said RF coil system comprises a birdcage resonator operable in a quadrature mode and in a linearly polarized mode, and wherein said sequence controller is configured to set said sequence to minimize said RF heating by selectively operating said birdcage resonator in one of said quadrature mode and said linearly polarized mode.

5. A magnetic resonance imaging system as claimed in claim 1 wherein said RF coil system has a coil design exhibiting a substantially linear transit sensitivity profile at least in a portion of said opening occupied by said examination subject.

6. A magnetic resonance imaging system as claimed in claim 1 wherein said RF coil system has a coil design comprising a multi-channel transmit array comprising a plurality of array resonators, and wherein said sequence controller is configured to supply respective currents to the individual array resonators to steer or modify said electric field to minimize RF heating in the examination subject due to the presence of said foreign object.

7. A method for operating a magnetic resonance imaging system comprising the steps of:
placing an examination subject in an opening of a magnetic resonance data acquisition unit, said examination subject carrying, extracorporeally or intracorporeally, a foreign object at least partially formed of electrically conductive material;
supplying current to an RF coil system substantially surrounding said opening in said data acquisition unit, said RF coil system being configured to exhibit a substantially linear sensitivity profile at least in a portion of said opening occupied by said examination subject, to radiate an RF field in the examination subject disposed in said opening, said RF field contributing to production of an electric field in the examination subject that causes RF heating of the examination subject;
also supplying current to a gradient coil system of the data acquisition unit to produce gradient magnetic fields in said examination subject;
with a sequence controller, activating and deactivating said RF field and said gradient magnetic fields in a sequence to produce, spatially encode, and read out magnetic resonance signals in said examination subject;
providing said sequence controller with information describing electrically conductive characteristics of said foreign object; and
in said sequence controller using said information to set said sequence, in combination with said linear sensitivity of said RF coil, to steer said electric field to minimize RF heating in the examination subject due to the presence of said foreign object.

8. A method as claimed in claim 7 wherein said examination subject has a specific absorption rate (SAR) for RF energy associated therewith, and comprising, in said sequence controller, setting said sequence to minimize said RF heating by minimizing said SAR.

9. A method as claimed in claim 7 wherein said foreign object comprises an elongate electrically conductive element, and comprising said sequence controller, setting said sequence to minimize said RF heating by minimizing a component of said electric field parallel to said elongate electrically conductive element.

10. A method as claimed in claim 7 wherein said RF coil system comprises a birdcage resonator operable in a quadrature mode and in a linearly polarized mode, and comprising, in said sequence controller, setting said sequence to minimize said RF heating by selectively operating said birdcage resonator in one of said quadrature mode and said linearly polarized mode.

11. A method as claimed in claim 7 comprising employing a coil design for said RF coil system exhibiting a substantially linear transit sensitivity profile at least in a portion of said opening occupied by said examination subject.

12. A method as claimed in claim 7 comprising employing an RF coil system having a coil design formed by a multi-channel transmit array comprising a plurality of array resonators, and comprising, via said sequence controller, supplying respective currents to the individual array resonators to steer or modify said electric field to minimize RF heating in the examination subject due to the presence of said foreign object.

13. A method as claimed in claim 7 comprising mechanically steering said RF coil system relative to the examination subject to minimize said RF heating in the examination subject due to the presence of said object.

14. An implant-compatible electrical device comprising:
a source of a radio-frequency (RF) field;
a device that causes said RF field to interact with a living subject carrying, extracorporeally or intracorporeally, a foreign object that is at least partially formed of electrically conductive material; and
a control device supplied with information describing electrically conductive characteristics of said foreign object, said control device being configured to steer or modify said electrical field, dependent on said information, to minimize RF heating in said subject due to the presence of the foreign object.

15. A method for reducing RF heating in a living subject comprising the steps of:
in an electrical device, generating a radio-frequency (RF) field;
placing said device relative to a living subject carrying, extracorporeally or intracorporeally, a foreign object that is at least partially formed of electrically conductive material, to cause said electrical field to interact with said living subject; and supplying a control device with information describing electrically conductive characteristics of said foreign object, and from said control device, steering or modifying said electrical field, dependent on said information, to minimize RF heating in said subject due to the presence of the foreign object.

* * * * *